US012787171B2

(12) United States Patent
Ikemura et al.

(10) Patent No.: US 12,787,171 B2
(45) Date of Patent: Nov. 3, 2026

(54) WIRING BODY AND DISPLAY DEVICE

(71) Applicant: TDK Corporation, Tokyo (JP)

(72) Inventors: Yuusuke Ikemura, Tokyo (JP); Yasumasa Harihara, Tokyo (JP); Tomoyuki Goi, Tokyo (JP); Hiroshi Shingai, Tokyo (JP)

(73) Assignee: TDK CORPORATION, Tokyo (JP)

( * ) Notice: Subject to any disclaimer, the term of this patent is extended or adjusted under 35 U.S.C. 154(b) by 184 days.

(21) Appl. No.: 18/713,870

(22) PCT Filed: Nov. 29, 2022

(86) PCT No.: PCT/JP2022/043939
§ 371 (c)(1),
(2) Date: May 28, 2024

(87) PCT Pub. No.: WO2023/095921
PCT Pub. Date: Jun. 1, 2023

(65) Prior Publication Data
US 2025/0151197 A1 May 8, 2025

(30) Foreign Application Priority Data
Nov. 29, 2021 (JP) ................................ 2021-193267

(51) Int. Cl.
*H05K 1/11* (2006.01)

(52) U.S. Cl.
CPC ... *H05K 1/119* (2013.01); *H05K 2201/10909* (2013.01)

(58) Field of Classification Search
None
See application file for complete search history.

(56) References Cited

U.S. PATENT DOCUMENTS 11,316,264 B2 * 4/2022 Ryu ........................ H01Q 1/38
12,495,106 B2 * 12/2025 Yun ........................ H01Q 1/243
2011/0147924 A1 6/2011 Kaneko et al.
2015/0068787 A1 3/2015 Chung et al.
2017/0228052 A1 * 8/2017 Nakamura ............ G06F 3/0445
2020/0326816 A1 10/2020 Ogura
2020/0403301 A1 12/2020 Ryu et al.
2025/0365858 A1 * 11/2025 Ikemura ............... H05K 1/0296

FOREIGN PATENT DOCUMENTS

JP 2011-129808 A 6/2011
JP 2015-053485 A 3/2015
JP 2021518071 A * 7/2021 ............. H01Q 1/364
WO 2017/187266 A1 11/2017

OTHER PUBLICATIONS

May 2, 2024 International Preliminary Report on Patentability issued in International Patent Application No. PCT/JP2022/043939.

* cited by examiner

*Primary Examiner* — Krystal Robinson
(74) *Attorney, Agent, or Firm* — Oliff PLC

(57) ABSTRACT

A wiring body includes an electrode and a terminal, in which the electrode and the terminal each have a conductor pattern including a plurality of openings, and the terminal has, on the conductor pattern, a conductor layer extending in a planar shape so as to cover at least a part of the conductor pattern.

13 Claims, 8 Drawing Sheets

WIRING BODY AND DISPLAY DEVICE

TECHNICAL FIELD

The present disclosure relates to a wiring body and a display device.

BACKGROUND ART

A wiring body has been conventionally known which includes a mesh-like electrode, a mesh-like lead wire electrically connected to the electrode, and a first mesh-like terminal electrically connected to the lead wire (for example, Patent Literature 1). In the wiring body, adherence to a connection terminal connected to the first terminal is improved by virtue of an anchor effect, and connection reliability is improved. The wiring body is used as a touch sensor or an antenna.

CITATION LIST

Patent Literature

Patent Literature 1: WO 2017/187266 A

SUMMARY

A wiring body according to an aspect of the present disclosure includes an electrode and a terminal, in which the electrode and the terminal each have a conductor pattern including a plurality of openings, and the terminal has, on the conductor pattern, a conductor layer extending in a planar shape so as to cover at least a part of the conductor pattern.

A display device according to an aspect of the present disclosure includes the wiring body.

DESCRIPTION OF EMBODIMENTS

Here, in the wiring body as described above, the first terminal has a mesh shape. This causes a problem that conduction between the terminal and an external connection terminal is difficult to be achieved.

In view of the above, an object of the present disclosure is to provide a wiring body capable of improving conduction between a terminal and an external connection terminal, and a display device.

According to an aspect of the present disclosure, it is possible to provide a wiring body capable of improving conduction between a terminal and an external connection terminal, and a display device.

Hereinafter, some embodiments of the present disclosure will be described in detail. However, the present disclosure is not limited to the following embodiments.

Figure 1:
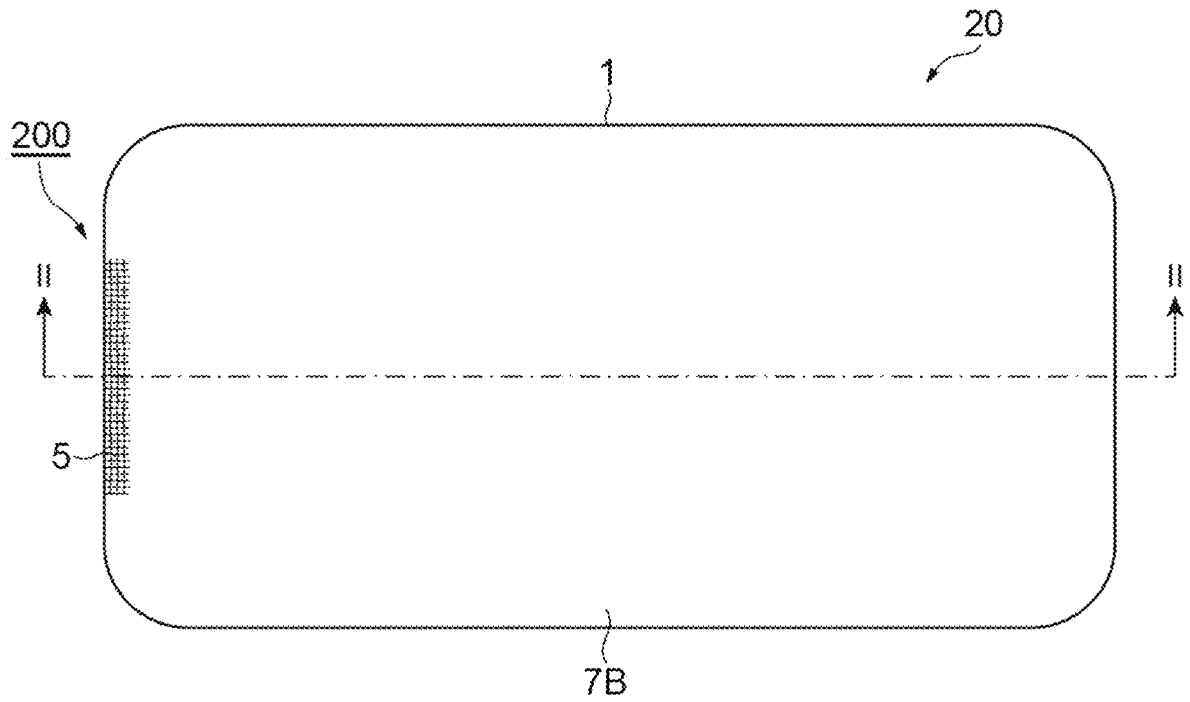
FIG. 1 is a plan view illustrating an electroconductive film including a wiring body according to an embodiment.
Figure 2:
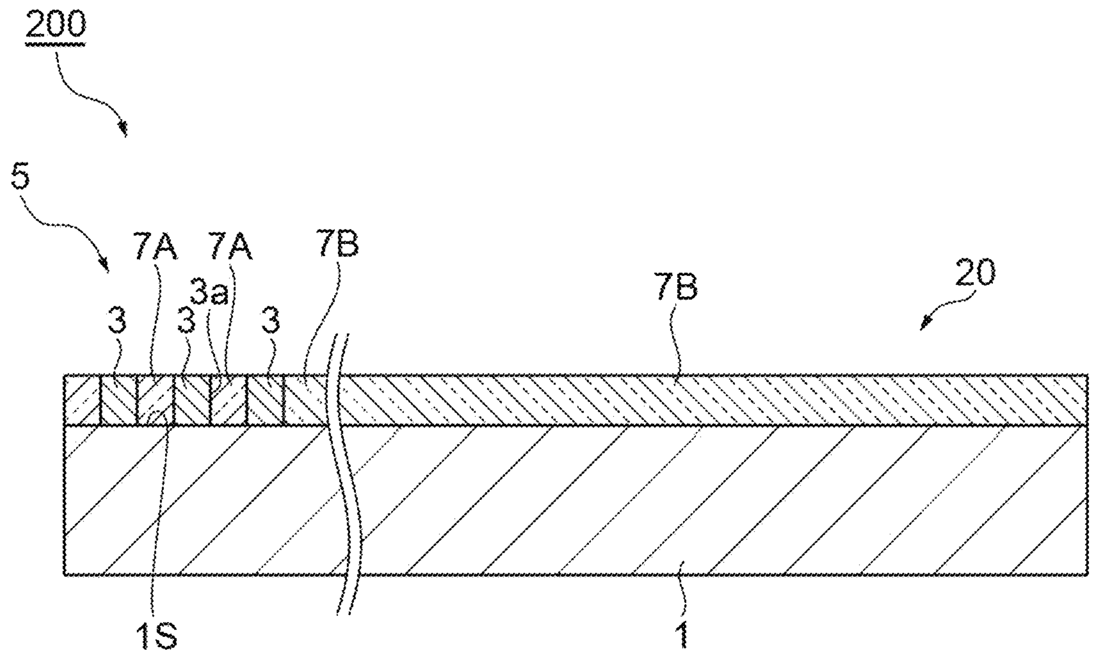
FIG. 2 is a cross-sectional view taken along the line II-II in FIG. 1.

FIG. 1 is a plan view illustrating an electroconductive film including a wiring body according to an embodiment of the present disclosure, and FIG. 2 is a cross-sectional view taken along the line II-II in FIG. 1. An electroconductive film 20 illustrated in FIGS. 1 and 2 includes a film-like light transmissive substrate 1 (substrate), an electroconductive layer 5 provided on one main surface 1S of the light transmissive substrate 1, and a light transmissive resin layer 7B provided on that one main surface 1S of the light transmissive substrate 1. The electroconductive layer 5 includes a conductor portion 3 that includes a part having a pattern extending in a direction along the main surface 1S of the light transmissive substrate 1 and including a plurality of openings 3*a*, and an insulating resin portion 7A filling the openings 3*a* of the conductor portion 3. In FIG. 2, the electroconductive layer 5 is illustrated in a deformed manner, and the width of the conductor portion 3 is illustrated in an emphasized manner. The thickness of each layer is also illustrated in a deformed manner. Details of the thickness of each layer will be described later. In the example illustrated in FIG. 1, the electroconductive layer 5 is formed near one short side of the electroconductive film 20, but the position where the electroconductive layer 5 is formed is not particularly limited, and the electroconductive layer 5 may be formed near a long side.

The light transmissive substrate 1 has optical transparency to an extent required when the electroconductive film 20 is incorporated in a display device. Specifically, the total light transmittance of the light transmissive substrate 1 may be 90 to 100%. The light transmissive substrate 1 may have a haze of 0 to 5%.

The light transmissive substrate 1 may be, for example, a transparent resin film, and examples thereof include a film of polyethylene terephthalate (PET), polycarbonate (PC), polyethylene naphthalate (PEN), cycloolefin polymer (COP), or polyimide (PI). Alternatively, the light transmissive substrate 1 may be a glass substrate.

Figure 3:
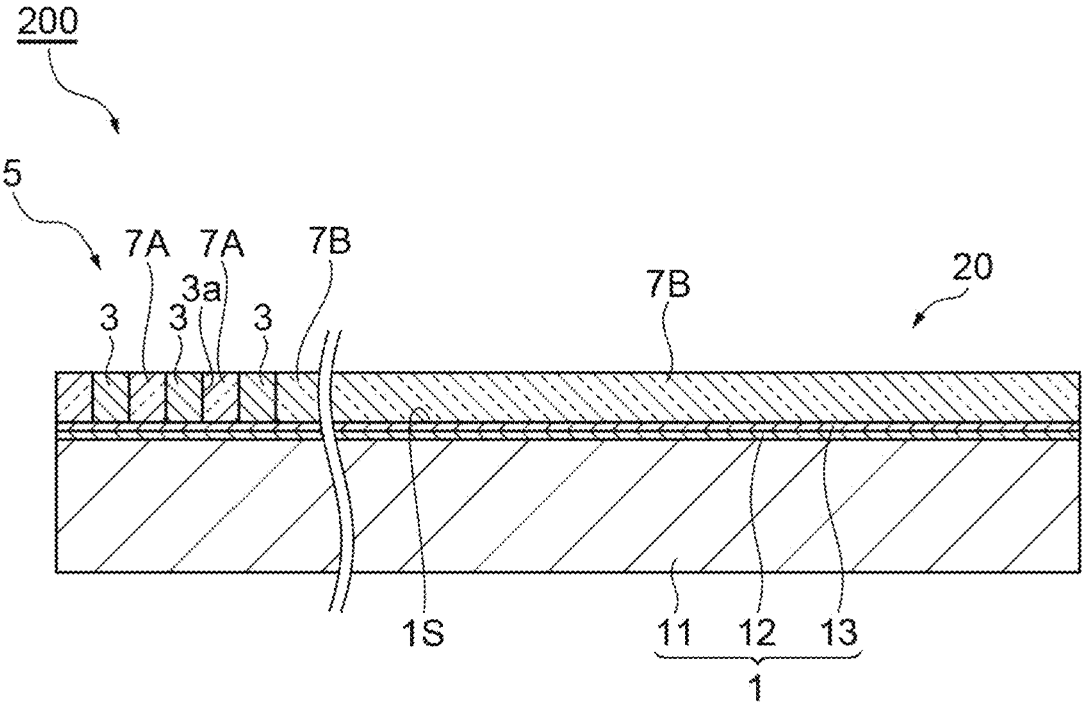
FIG. 3 is a cross-sectional view illustrating an electroconductive film according to a modification.

For example, as illustrated in FIG. 3, the light transmissive substrate 1 may be a laminate including a light transmissive support film 11, and an intermediate resin layer 12 and an underlying layer 13 sequentially provided on the support film 11. The support film 11 can be the transparent resin film. The underlying layer 13 is a layer provided in order to form the conductor portion 3 by electroless plating or the like. In a case where the conductor portion 3 is formed by another method, the underlying layer 13 is not necessarily provided. It is not essential that the intermediate resin layer 12 is provided between the support film 11 and the underlying layer 13.

The thickness of the light transmissive substrate 1 or the support film 11 constituting the same may be 10 μm or more, 20 μm or more, or 35 μm or more, and may be 500 μm or less, 200 μm or less, or 100 μm or less.

Providing the intermediate resin layer 12 can improve adhesion between the support film 11 and the underlying layer 13. In a case where the underlying layer 13 is not provided, the intermediate resin layer 12 is provided between the support film 11 and the light transmissive resin layer 7B, so that adhesion between the support film 11 and the light transmissive resin layer 7B can be improved.

The intermediate resin layer 12 may be a layer containing a resin and an inorganic filler. Examples of the resin constituting the intermediate resin layer 12 include an acrylic resin. Examples of the inorganic filler include silica.

The thickness of the intermediate resin layer 12 may be, for example, 5 nm or more, 100 nm or more, or 200 nm or more, and may be 10 μm or less, 5 μm or less, or 2 μm or less.

The underlying layer 13 may be a layer containing a catalyst and a resin. The resin may be a cured product of a curable resin composition. Examples of a curable resin contained in the curable resin composition include an amino resin, a cyanate resin, an isocyanate resin, a polyimide resin, an epoxy resin, an oxetane resin, a polyester, an allyl resin, a phenolic resin, a benzoxazine resin, a xylene resin, a ketone resin, a furan resin, a COPNA resin, a silicon resin, a dicyclopentadiene resin, a benzocyclobutene resin, an episulfide resin, a thiol-ene resin, a polyazomethine resin, a polyvinyl benzyl ether compound, acenaphthylene, and an ultraviolet curable resin containing a functional group that causes a polymerization reaction with ultraviolet rays such as an unsaturated double bond, a cyclic ether, and a vinyl ether.

The catalyst contained in the underlying layer 13 may be an electroless plating catalyst. The electroless plating catalyst may be a metal selected from Pd, Cu, Ni, Co, Au, Ag, Pd, Rh, Pt, In, and Sn, or may be Pd. The catalyst may be one kind alone or a combination of two or more kinds. Usually, the catalyst is dispersed in the resin as catalyst particles.

The content of the catalyst in the underlying layer 13 may be 3 mass % or more, 4 mass % or more, or 5 mass % or more, and may be 50 mass % or less, 40 mass % or less, or 25 mass % or less with respect to the total amount of the underlying layer 13.

The thickness of the underlying layer 13 may be 10 nm or more, 20 nm or more, or 30 nm or more, and may be 500 nm or less, 300 nm or less, or 150 nm or less.

The light transmissive substrate 1 may further include a protective layer provided on a main surface of the support film 11 opposite to the light transmissive resin layer 7B and the conductor portion 3. Providing the protective layer prevents the support film 11 from being scratched. The protective layer can be a layer similar to the intermediate resin layer 12. The thickness of the protective layer may be 5 nm or more, 50 nm or more, or 500 nm or more, and may be 10 μm or less, 5 μm or less, or 2 μm or less.

The conductor portion 3 constituting the electroconductive layer 5 includes a part having a pattern including the openings 3*a*. The pattern including the openings 3*a* is a mesh-like pattern that is formed by a plurality of linear portions intersecting each other and includes the plurality of openings 3*a* regularly arranged. The conductor portion 3 having the mesh-like pattern can favorably function as, for example, a radiating element, a power supply portion, and a ground portion of an antenna. Further, the conductor portion 3 may have a part corresponding to an electroconductive member such as a ground terminal and a power supply terminal. The configuration of the pattern of the conductor portion 3 in the electroconductive layer 5 will be detailed later.

The conductor portion 3 may contain metal. The conductor portion 3 may contain at least one metal selected from copper, nickel, cobalt, palladium, silver, gold, platinum, and tin, or may contain copper. The conductor portion 3 may be metal plating formed by a plating method. The conductor portion 3 may further contain a nonmetallic element such as phosphorus within a range in which appropriate conductivity is maintained.

The conductor portion 3 may be a laminate including a plurality of layers. In addition, the conductor portion 3 may have a blackened layer as a surface layer portion on a side opposite to the light transmissive substrate 1. The blackened layer can contribute to improvement in visibility of a display device in which the electroconductive film is incorporated.

The insulating resin portion 7A is formed of a light transmissive resin and is provided so as to fill the openings 3*a* of the conductor portion 3, and the insulating resin portion 7A and the conductor portion 3 usually form a flat surface.

The light transmissive resin layer 7B is formed of a light transmissive resin. The total light transmittance of the light transmissive resin layer 7B may be 90 to 100%. The light transmissive resin layer 7B may have a haze of 0 to 5%.

The difference between the light transmissive substrate 1 (or the refractive index of the support film constituting the light transmissive substrate 1) and the refractive index of the light transmissive resin layer 7B may be 0.1 or less. As a result, good visibility of a display image is more easily achieved. The refractive index (nd 25) of the light transmissive resin layer 7B may be, for example, 1.0 or more, and may be 1.7 or less, 1.6 or less, or 1.5 or less. The refractive index can be measured by a spectroscopic ellipsometer. In terms of uniformity of the optical path length, the conductor portion 3, the insulating resin portion 7A, and the light transmissive resin layer 7B may have substantially the same thickness.

The resin forming the insulating resin portion 7A and the light transmissive resin layer 7B may be a cured product of a curable resin composition (photocurable resin composition or thermosetting resin composition). The curable resin composition forming the insulating resin portion 7A and/or the light transmissive resin layer 7B includes a curable resin, and examples thereof include an acrylic resin, an amino resin, a cyanate resin, an isocyanate resin, a polyimide resin, an epoxy resin, an oxetane resin, a polyester, an allyl resin, a phenolic resin, a benzoxazine resin, a xylene resin, a ketone resin, a furan resin, a COPNA resin, a silicon resin, a dicyclopentadiene resin, a benzocyclobutene resin, an episulfide resin, a thiol-ene resin, a polyazomethine resin, a polyvinyl benzyl ether compound, acenaphthylene, and an ultraviolet curable resin containing a functional group that causes a polymerization reaction with ultraviolet rays such as an unsaturated double bond, a cyclic ether, and a vinyl ether.

The resin forming the insulating resin portion 7A and the resin forming the light transmissive resin layer 7B may be the same. Since the insulating resin portion 7A and the light transmissive resin layer 7B formed of the same resin have the same refractive index, the uniformity of the optical path length transmitted through the electroconductive film 20 can be further improved. In a case where the resin forming the insulating resin portion 7A and the resin forming the light transmissive resin layer 7B are the same, for example, the insulating resin portion 7A and the light transmissive resin layer 7B can be easily and collectively formed by forming a pattern from one curable resin layer by an imprinting method or the like.

The electroconductive film 20 can be manufactured, for example, by a method including pattern formation by the imprinting method. An example of a method for manufacturing the electroconductive film 20 includes: preparing the light transmissive substrate 1 including the support film, the intermediate resin layer, and the underlying layer containing the catalyst, the intermediate resin layer, and the underlying layer being provided on one main surface of the support film; forming the curable resin layer on the main surface 1S on the underlying layer side of the light transmissive substrate 1; forming a trench in which the underlying layer is exposed by an imprinting method using a mold having a convex portion; and forming the conductor portion 3 filling the trench by an electroless plating method in which metal plating is grown from the underlying layer. The curable resin layer is cured in a state where the mold is pushed into the curable resin layer to thereby form collectively the insulating resin portion 7A having a pattern including an opening with an inverted shape of the convex portion of the mold, and the light transmissive resin layer 7B. The method for forming the insulating resin portion 7A having the pattern including the opening is not limited to the imprinting method, and any method such as photolithography can be applied.

Figure 4:
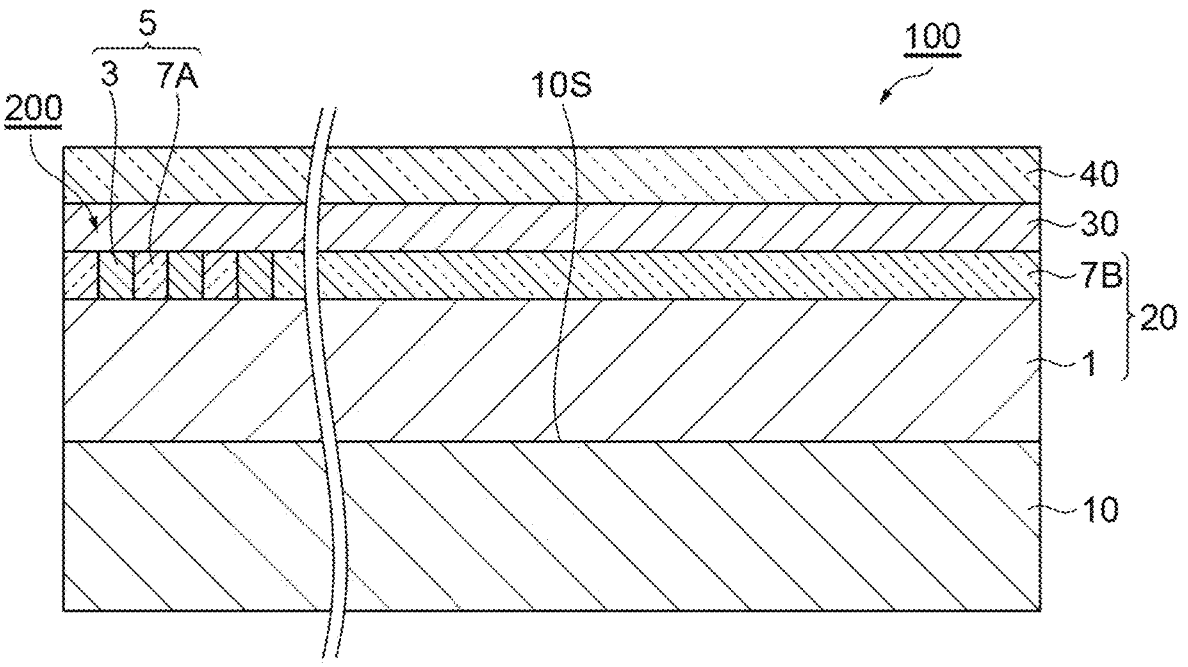
FIG. 4 is a cross-sectional view illustrating a display device according to an embodiment.

The electroconductive film described above as an example can be incorporated into a display device as, for example, a planar transparent antenna. The display device may be, for example, a liquid crystal display device or an organic EL display device. FIG. 4 is a cross-sectional view illustrating an embodiment of a display device in which an electroconductive film is incorporated. A display device 100 illustrated in FIG. 4 includes an image display unit 10 having an image display region 10S, an electroconductive film 20, a polarizing plate 30, and a cover glass 40. The electroconductive film 20, the polarizing plate 30, and the cover glass 40 are laminated, in this order from the image display unit 10 side, on the image display region 10S side of the image display unit 10. The configuration of the display device is not limited to the form of FIG. 4, and can be appropriately changed as necessary. For example, the polarizing plate 30 may be provided between the image display unit 10 and the electroconductive film 20. The image display unit 10 may be, for example, a liquid crystal display unit. As the polarizing plate 30 and the cover glass 40, those commonly used in a display device can be used. The polarizing plate 30 and the cover glass 40 are not necessarily provided. Light for image display emitted from the image display region 10S of the image display unit 10 passes through a path having a highly uniform optical path length including the electroconductive film 20. This makes it possible to display an image with high uniformity and favorable quality with suppressed moire.

Figure 5:
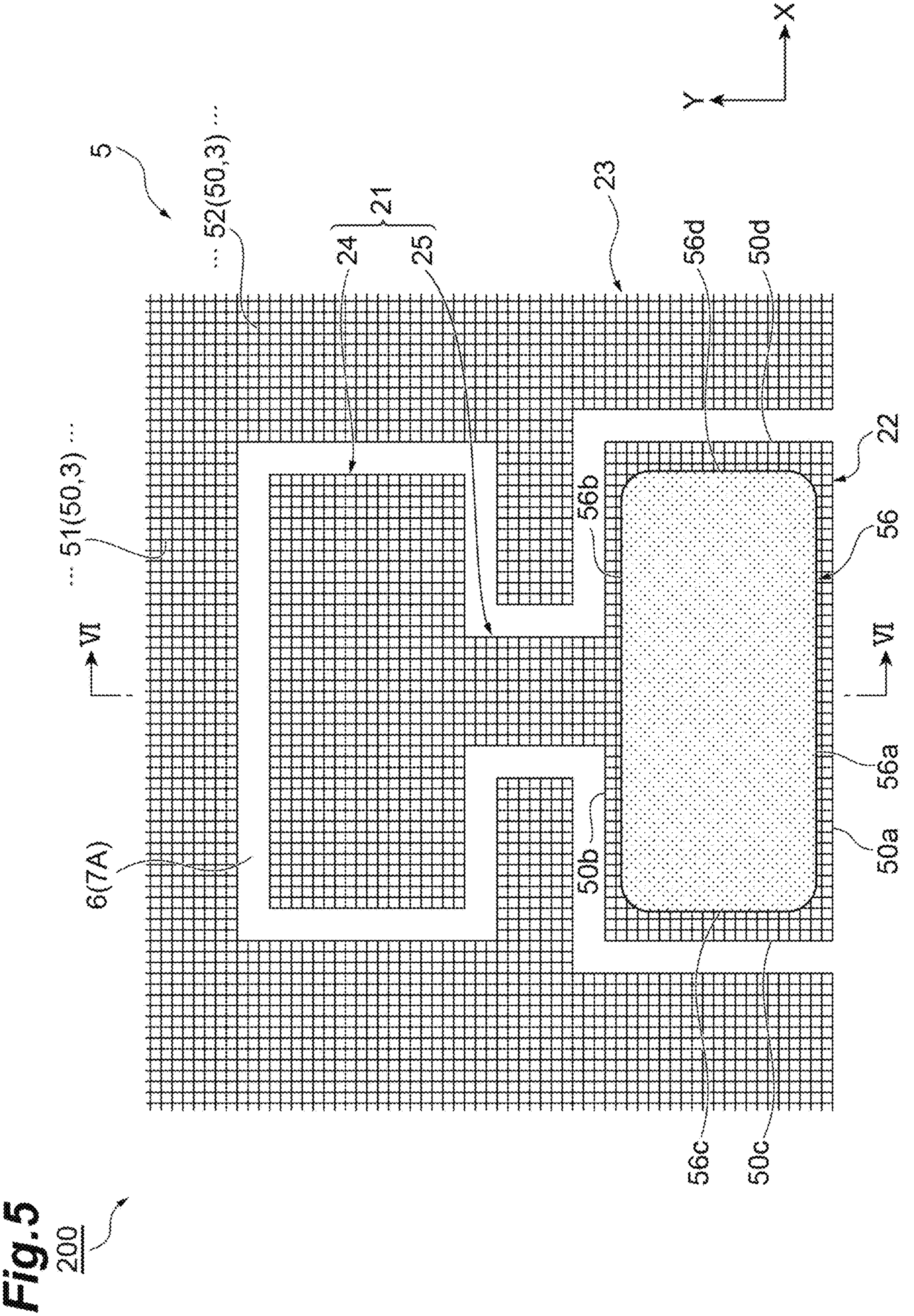
FIG. 5 is a plan view of a wiring body.

Next, a configuration of a wiring body 200 according to an embodiment of the present disclosure will be described in detail with reference to FIG. 5. The wiring body 200 includes the electroconductive layer 5 described above. FIG. 5 is a plan view of the wiring body 200. FIG. 5 is an enlarged view of a part of the wiring body. In the following description, it is assumed that XY coordinates are set with respect to a plane parallel to the main surface 1S. The Y-axis direction is a direction along the main surface 1S, and corresponds to a direction orthogonal to a side portion of the electroconductive film 20 in the example illustrated in FIG. 1. The center side of the electroconductive film 20 is defined as a positive side in the Y-axis direction, and the outer peripheral side of the electroconductive film 20 is defined as a negative side in the Y-axis direction. The X-axis direction is a direction orthogonal to the Y-axis direction along the main surface 1S, and corresponds to a direction in which the side portion of the electroconductive film 20 extends in the example illustrated in FIG. 1. One side in which the side portion of the electroconductive film 20 extends is defined as a positive side in the X-axis direction, and the other side is defined as a negative side in the X-axis direction.

As illustrated in FIG. 5, the wiring body 200 includes a mesh-like conductor pattern 50 as the conductor portion 3. The mesh-like conductor pattern 50 includes a first electroconductive line 51 and a plurality of second electroconductive lines 52. The first electroconductive line 51 is the linear conductor portion 3 extending parallel to the Y-axis direction. The plurality of first electroconductive lines 51 is arranged to be spaced apart from each other in the X-axis direction. The plurality of first electroconductive lines 51 is arranged to be spaced apart at a constant pitch. The second electroconductive line 52 is the linear conductor portion 3 extending parallel to the X-axis direction. The plurality of second electroconductive lines 52 is arranged to be spaced apart from each other in the Y-axis direction. The plurality of second electroconductive lines 52 is arranged to be spaced apart at a constant pitch. The thickness of the electroconductive lines 51 and 52 is not particularly limited, and may be set to, for example, 1 to 3 μm. The pitch of the electroconductive lines 51 and 52 is not particularly limited, and may be set to, for example, 100 to 300 μm. The first electroconductive line 51 does not need to be parallel to the Y-axis direction as long as the first electroconductive line 51 extends in the Y-axis direction, and the second electroconductive line 52 does not need to be parallel to the X-axis direction as long as the second electroconductive line 52 extends in the X-axis direction.

The wiring body 200 includes an electrode 21, a terminal 22, and a ground portion 23. The electrode 21, the terminal 22, and the ground portion 23 each have the mesh-like conductor pattern 50 described above. The conductor pattern 50 of each of the electrode 21, the terminal 22, and the ground portion 23 is not limited to the mesh-like conductor pattern as long as it is a conductor pattern including a plurality of openings.

The electrode 21 includes a radiating element portion 24 and a power supply portion 25. The radiating element portion 24 is a region that radiates a signal as an antenna. The radiating element portion 24 has a rectangular shape having two sides parallel to the Y-axis direction and two sides parallel to the X-axis direction. Although the radiating element portion 24 having a rectangular shape is illustrated in the drawing, the shape of the radiating element portion 24 is not particularly limited, and may be a square shape. The power supply portion 25 is a region that feeds power to the radiating element portion 24. The power supply portion 25 has a belt-like shape extending parallel to the Y-axis direction. The power supply portion 25 is connected to the side of the radiating element portion 24 on the negative side in the Y-axis direction.

The terminal 22 is connected to the electrode 21. The terminal 22 is connected to a connection terminal of an external device. The terminal 22 has a rectangular shape having two sides parallel to the Y-axis direction and two sides parallel to the X-axis direction. The terminal 22 is connected to the power supply portion 25 at a side portion of the terminal 22 on the positive side in the Y-axis direction. Although the terminal 22 having a rectangular shape is illustrated in the drawing, the shape of the terminal 22 is not particularly limited, and may be a square shape.

The ground portion 23 is an electrically grounded region. The ground portion 23 is connected to a ground terminal (not illustrated). The ground portion 23 is formed so as to surround the radiating element portion 24, the power supply portion 25, and the terminal 22. A slit portion 6 in which no mesh is formed is provided between the ground portion 23 and each side of the radiating element portion 24, between the ground portion 23 and each side of the power supply portion 25, and between the ground portion 23 and each side of the terminal 22. The insulating resin portion 7A is formed in the slit portion 6. As a result, the ground portion 23, the radiating element portion 24, the power supply portion 25, and the terminal 22 are electrically insulated from one another.

The terminal 22 has, on the conductor pattern 50, a conductor layer 56 that extends in a planar shape so as to cover at least a part of the conductor pattern 50. The conductor layer 56 is preferably formed so as to cover substantially the entire region of the terminal 22. The area of the conductor layer 56 is not particularly limited, but is preferably 95% or more of the entire area of the terminal 22, for example.

In plan view, the outer edge of the conductor layer 56 is located inside the outer edge of the conductor pattern 50 in the terminal 22. Specifically, an outer edge 56*a* of the conductor layer 56 on the negative side in the Y-axis direction is located on the positive side in the Y-axis direction with respect to an outer edge 50*a* of the conductor pattern 50 of the terminal 22 on the negative side in the Y-axis direction. An outer edge 56*b* of the conductor layer 56 on the positive side in the Y-axis direction is located on the negative side in the Y-axis direction with respect to an outer edge 50*b* of the conductor pattern 50 of the terminal 22 on the positive side in the Y-axis direction. An outer edge 56*c* of the conductor layer 56 on the negative side in the X-axis direction is located on the positive side in the X-axis direction with respect to an outer edge 50*c* of the conductor pattern 50 of the terminal 22 on the negative side in the X-axis direction. An outer edge 56*d* of the conductor layer 56 on the positive side in the X-axis direction is located on the negative side in the X-axis direction with respect to an outer edge 50*d* of the conductor pattern 50 of the terminal 22 on the positive side in the X-axis direction. The difference between the outer edge of the conductor layer 56 and the outer edge of the conductor pattern 50 on the positive side in the Y-axis direction, and the difference therebetween on the negative side in the Y-axis direction each may be smaller than the dimension of the conductor layer 56 in the Y-axis direction, and the difference between the outer edge of the conductor layer 56 and the outer edge of the conductor pattern 50 on the positive side in the X-axis direction, and the difference therebetween on the negative side in the X-axis direction each may be smaller than the dimension of the conductor layer 56 in the X-axis direction. In this case, it is possible to prevent the outer edge of the conductor layer 56 from extending beyond the outer edge of the conductor pattern 50 in the terminal 22 and to improve conduction between the terminal 22 and an external connection terminal. For example, the difference between the outer edge of the conductor layer 56 and the outer edge of the conductor pattern 50 is preferably equal to or less than the pitch of the electroconductive lines 51 and 52.

Figure 6:
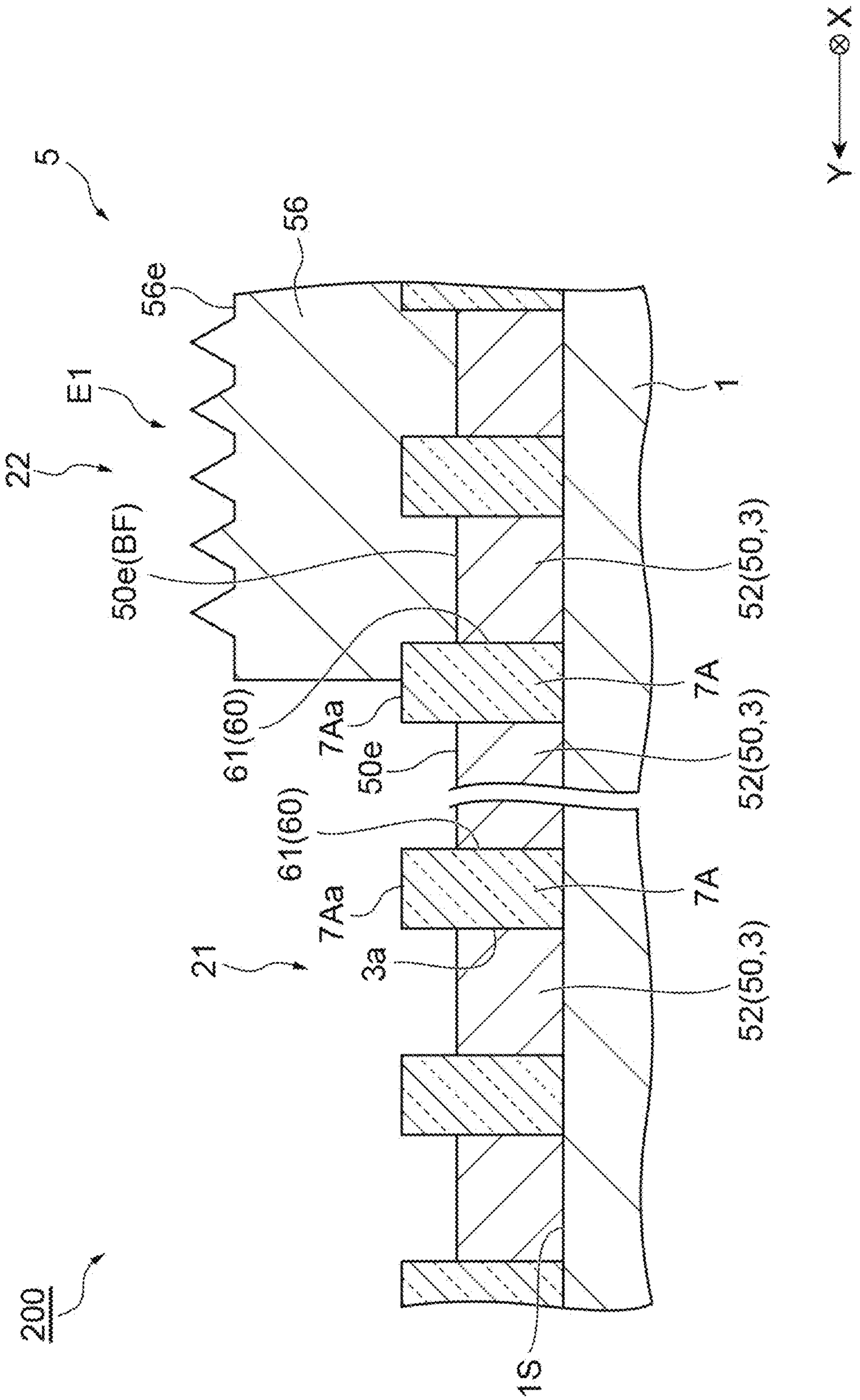
FIG. 6 is an enlarged cross-sectional view taken along the line VI-VI in FIG. 5.

Next, a cross-sectional structure of the wiring body 200 will be described with reference to FIG. 6. FIG. 6 is an enlarged cross-sectional view taken along the line VI-VI in FIG. 5. As illustrated in FIG. 6, the wiring body 200 further includes the light transmissive substrate 1 on which the electrode 21 and the terminal 22 are provided, and the insulating resin portion 7A provided on the light transmissive substrate 1.

The insulating resin portion 7A has a mesh-like trench 60. The trench 60 is configured by a pattern of groove portions 61 between the insulating resin portion 7A and the adjacent insulating resin portions 7A. The groove portions 61 are formed in a pattern corresponding to the mesh structure of the conductor pattern 50 of the terminal 22. Therefore, the mesh pattern of the trench 60 and the conductor pattern 50 of the terminal 22 coincide with each other. At the bottom of the groove portion 61, the main surface 1S of the light transmissive substrate 1 is exposed from the insulating resin portion 7A.

The conductor pattern 50 of the terminal 22 is provided in the trench 60. The second electroconductive line 52 of the conductor pattern 50 is formed by filling a conductive material into the groove portions 61 extending in the X-axis direction among the groove portions 61 of the trench 60. The first electroconductive line 51 of the conductor pattern 50 is also formed by filling a conductive material into the groove portions 61 (not illustrated) extending in the Y-axis direction among the groove portions 61 of the trench 60.

The conductor layer 56 is formed so as to cover a surface 50*e* of the conductor pattern 50 and a surface 7Aa of the insulating resin portion 7A in the terminal 22. The conductor layer 56 extends in parallel to the XY plane so as to continuously cover the surfaces 50*e* of the plurality of first electroconductive lines 51, the surfaces 50*e* of the plurality of second electroconductive lines 52, and the surfaces 7Aa of the plurality of insulating resin portions 7A without gaps. In the example illustrated in FIG. 5, the conductor layer 56 is integrally formed without gaps in a region surrounded by the outer edges 56*a*, 56*b*, 56*c*, and 56*d*. However, the conductor layer 56 may be divided into a plurality of regions, and the conductor pattern 50 and the insulating resin portion 7A may be exposed in a slit shape between the divided regions.

The terminal 22 has a region E1 in which the height position of an interface BF between the conductor layer 56 and the conductor pattern 50 is different from that of the surface 7Aa of the insulating resin portion 7A. The height position of the interface BF between the conductor layer 56 and the conductor pattern 50 coincides with the height position of the surface 50*e* of the conductor pattern 50. The entire region of the terminal 22 may be the region E1. Alternatively, a part of the terminal 22 may be the region E1. In such a case, except for the region E1 of the terminal 22, the height position of the surface 7Aa of the insulating resin portion 7A and the height position of the interface BF coincide with each other.

In the region E1, the ratio of the interface BF located at the height position closer to the light transmissive substrate 1 side than the surface 7Aa of the insulating resin portion 7A is high. In the part illustrated in FIG. 6, when the main surface 1S is used as the reference, the surface 50*e* of the conductor pattern 50 is disposed at a position lower than the surface 7Aa of the insulating resin portion 7A. Therefore, the interface BF is located at a height position closer to the substrate 1 than the surface 7Aa. In the region E1, the interface BF may be located at a height position closer to the substrate 1 than the surface 7Aa in the entire region. Alternatively, in the region E1, the interface BF may be located at a height position closer to the substrate 1 than the surface 7Aa in half or more of the region.

The sum of the thicknesses of the conductor pattern 50 of the terminal 22 and the conductor layer 56 is larger than the thickness of the conductor pattern 50 of the electrode 21. The thickness of the conductor pattern 50 is determined depending on the dimension between the main surface 1S and the surface 50*e*. The thickness of the conductor layer 56 is determined depending on the dimension between the interface BF and the surface 56*e* of the conductor layer 56. In the example illustrated in FIG. 6, the thickness of the conductor pattern 50 of the terminal 22 is the same as the thickness of the conductor pattern 50 of the electrode 21. Therefore, the sum of the thicknesses of the conductor pattern 50 of the terminal 22 and the conductor layer 56 is a value obtained by adding the thickness of the conductor layer 56 to the thickness of the conductor pattern 50 of the electrode 21.

However, it is possible that the thickness of the conductor pattern 50 of the terminal 22 is not the same as the thickness of the conductor pattern 50 of the electrode 21. The thickness of the conductor pattern 50 of the terminal 22 may be smaller or larger than the thickness of the conductor pattern 50 of the electrode 21. In a case where the thickness of the conductor pattern 50 of the terminal 22 is smaller than the thickness of the conductor pattern 50 of the electrode 21, it is only required that the value obtained by adding the thickness of the conductor layer 56 to the thickness of the conductor pattern 50 of the terminal 22 is larger than the value of the thickness of the conductor pattern 50 of the electrode 21.

The thickness of the conductor layer 56 is larger than the thickness of the conductor pattern 50 of the terminal 22. The surface 56*e* of the conductor layer 56 is disposed at a position higher than the surface 7Aa of the insulating resin portion 7A. The thickness of the surface 56*e* of the conductor layer 56 with respect to the surface 7Aa of the insulating resin portion 7A may also be larger than the thickness of the conductor pattern 50 of the terminal 22. However, the thickness of the conductor layer 56 is not particularly limited, and may be equal to or less than the thickness of the conductor pattern 50 of the terminal 22.

The surface roughness of the conductor layer 56 is greater than the surface roughness of the conductor pattern 50 of the terminal 22. The surface roughness of the conductor layer 56 is the roughness of the surface 56*e*. The surface roughness of the conductor pattern 50 of the terminal 22 is the roughness of the surface 50*e*. The surface roughness of the conductor layer 56 and the surface roughness of the conductor pattern 50 of the terminal 22 are, for example, one of surface roughness parameters defined in ISO25178, and indicate arithmetic mean height Sa represented by the average of the absolute values of peak height and valley depth in a measuring surface. The arithmetic mean height Sa can be measured in a non-contact method using, for example, VK-250X (Keyence Corporation). The upper limit of the surface roughness of the conductor layer 56 may be equal to or less than the particle size of a conductive particle contained in an adhesive (for example, ACF bonding) used for bonding to an external connection terminal to be bonded to the conductor layer 56. For example, in a case where the average particle size of the conductive particles of the adhesive is 20 μm, the surface roughness of the conductor layer 56 is 20 μm or less.

The conductor layer 56 may contain silver. In such a case, the conductor pattern 50 may contain copper. However, the material of the conductor layer 56 is not particularly limited. Note that the material of the conductor pattern 50 may be the metal exemplified in the description about the conductor portion 3, in addition to copper.

Next, functions and effects of the wiring body 200 and the display device 100 according to the present embodiment will be described.

In the wiring body 200 described above, the electrode 21 and the terminal 22 each have the mesh-like conductor pattern 50. Among them, the terminal 22 is connected to an external connection terminal, and electrically connects the connection terminal and the electrode 21. The terminal 22 has, on the conductor pattern 50, a conductor layer 56 that extends in a planar shape so as to cover at least a part of the conductor pattern 50. The terminal 22 is therefore connected to the external connection terminal via the conductor layer 56 extending in a planar shape. This configuration can increase conduction between the terminal 22 and the external connection terminal as compared with a case where the mesh-like conductor pattern 50 is connected to the external connection terminal.

In plan view, the outer edge of the conductor layer 56 may be located inside the outer edge of the conductor pattern 50 in the terminal 22. In this case, it is possible to prevent the outer edge of the conductor layer 56 from extending beyond the outer edge of the conductor pattern 50 in the terminal 22. In this case, it is possible to prevent the conductor layer 56 from short-circuiting with another conductor pattern 50 adjacent to the terminal 22. In addition, it is possible to prevent the visibility from being increased due to protrusion of the conductor layer 56 toward the electrode 21 side. This configuration is adopted in view of giving priority to the advantage that the problem caused by the protrusion of the conductor layer 56 can be prevented although the conduction with the connection terminal is lowered due to reduction in area of the conductor layer 56 with respect to the terminal 22.

The wiring body 200 may further include the light transmissive substrate 1 on which the electrode 21 and the terminal 22 are provided, and the insulating resin portion 7A provided on the light transmissive substrate 1, the insulating resin portion 7A may have the mesh-like trench 60, the conductor pattern 50 of the terminal 22 may be provided in the trench 60, and the terminal 22 may have the region E1 in which the height position of the interface BF between the conductor layer 56 and the conductor pattern 50 is different from that of the surface 7Aa of the insulating resin portion 7A. In this case, the mesh-like insulating resin portion 7A or the conductor pattern 50 wedges into the conductor layer 56, which can increase the connection reliability of the conductor layer 56 with respect to the conductor pattern 50 of the terminal 22.

In the region E1, the ratio of the interface BF located at the height position closer to the transmissive substrate 1 side than the surface 7Aa of the insulating resin portion 7A may be high. In this case, the mesh-like insulating resin portion 7A wedges into the conductor layer 56, which can increase the connection reliability of the conductor layer 56 with respect to the conductor pattern 50 of the terminal 22.

The sum of the thicknesses of the conductor pattern 50 of the terminal 22 and the conductor layer 56 may be larger than the thickness of the conductor pattern 50 of the electrode 21. In this case, the thickness of the terminal 22 is made larger than that of the electrode 21, which makes it easy for an external connection terminal to be connected to the terminal 22.

The thickness of the conductor layer 56 may be larger than the thickness of the conductor pattern 50 of the terminal 22. In this case, the thickness of the terminal 22 is increased, which makes it easy for an external connection terminal to be connected to the terminal 22.

The surface roughness of the conductor layer 56 may be greater than the surface roughness of the conductor pattern 50 of the terminal 22. In this case, the connection strength of an external connection terminal to the surface of the conductor layer 56 can be increased.

The conductor layer 56 may contain silver, and the conductor pattern 50 may contain copper. In this case, a conductor having high conductivity is used for the part connected to an external connection terminal, which reduces the resistance value and further increases the conduction with the external connection terminal.

The display device 100 according to an aspect of the present disclosure includes the wiring body 200.

According to the display device, functions and effects similar to those of the above-described wiring body can be obtained.

The present disclosure is not limited to the above-described embodiment.

For example, the configuration illustrated in FIG. 5 is merely an example of the configuration of the electroconductive layer 5, and the shapes of the electrode 21, the terminal 22, and the ground portion 23 may be appropriately changed.

FIG. 1 is merely an example of the overall configuration of the electroconductive film, and the electroconductive layer may be formed in any range and shape in the electroconductive film.

Although the display device has been exemplified as the device to which the electroconductive film is applied, the electroconductive film may be applied to other devices. For example, the electroconductive film may be applied to glass or the like of a building, an automobile, or the like.

In the embodiment described above, as for the mesh-like conductor pattern 50 of the terminal 22 connected to the electrode 21, the conductor layer 56 extending in a planar shape so as to cover at least a part of the mesh-like conductor pattern 50 is formed. In addition, a conductor layer 56 having the same purpose as that of the conductor layer 56 may be formed in a region, of the ground portion 23, corresponding to a terminal (ground terminal in the wiring body 200) to be connected to an external ground terminal. Such a terminal of the ground portion 23 may be formed in a region, of the ground portion 23, adjacent to the terminal 22 in the X-axis direction, for example. That is, as for the mesh-like conductor pattern 50 of the terminal in the ground portion 23, the conductor layer 56 extending in a planar shape so as to cover at least a part of the mesh-like conductor pattern 50 may be formed. As a result, it is possible to obtain the same functions and effects as those of the foregoing embodiment also for the terminal in the ground portion 23. The wiring body may have only the conductor layer 56 for the terminal 22, may have only the conductor layer 56 for the terminal in the ground portion 23, or may have both the conductor layer 56 for the terminal 22 and the conductor layer 56 for the terminal in the ground portion 23.

In the embodiment described above, the wiring body used as an antenna has been exemplified; however, the application of the structure of the wiring body is not limited, and the wiring body may be applied to, for example, a touch sensor.

Figure 7:
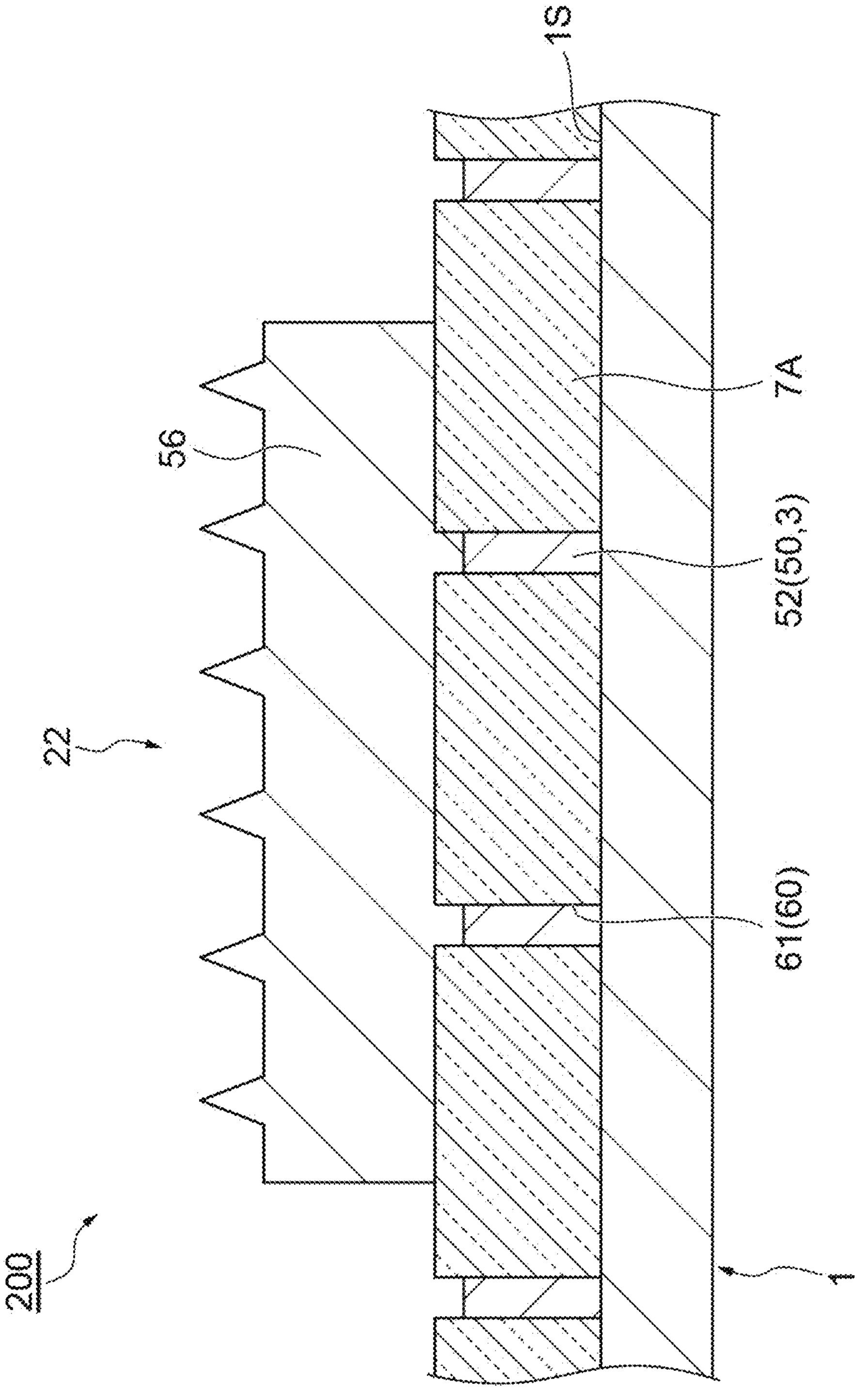
FIG. 7 is a cross-sectional view illustrating a wiring body according to a modification.

The cross-sectional shape of the wiring body 200 is not limited to that illustrated in FIG. 6, and the structure illustrated in FIG. 7 may be employed.

Figure 8:
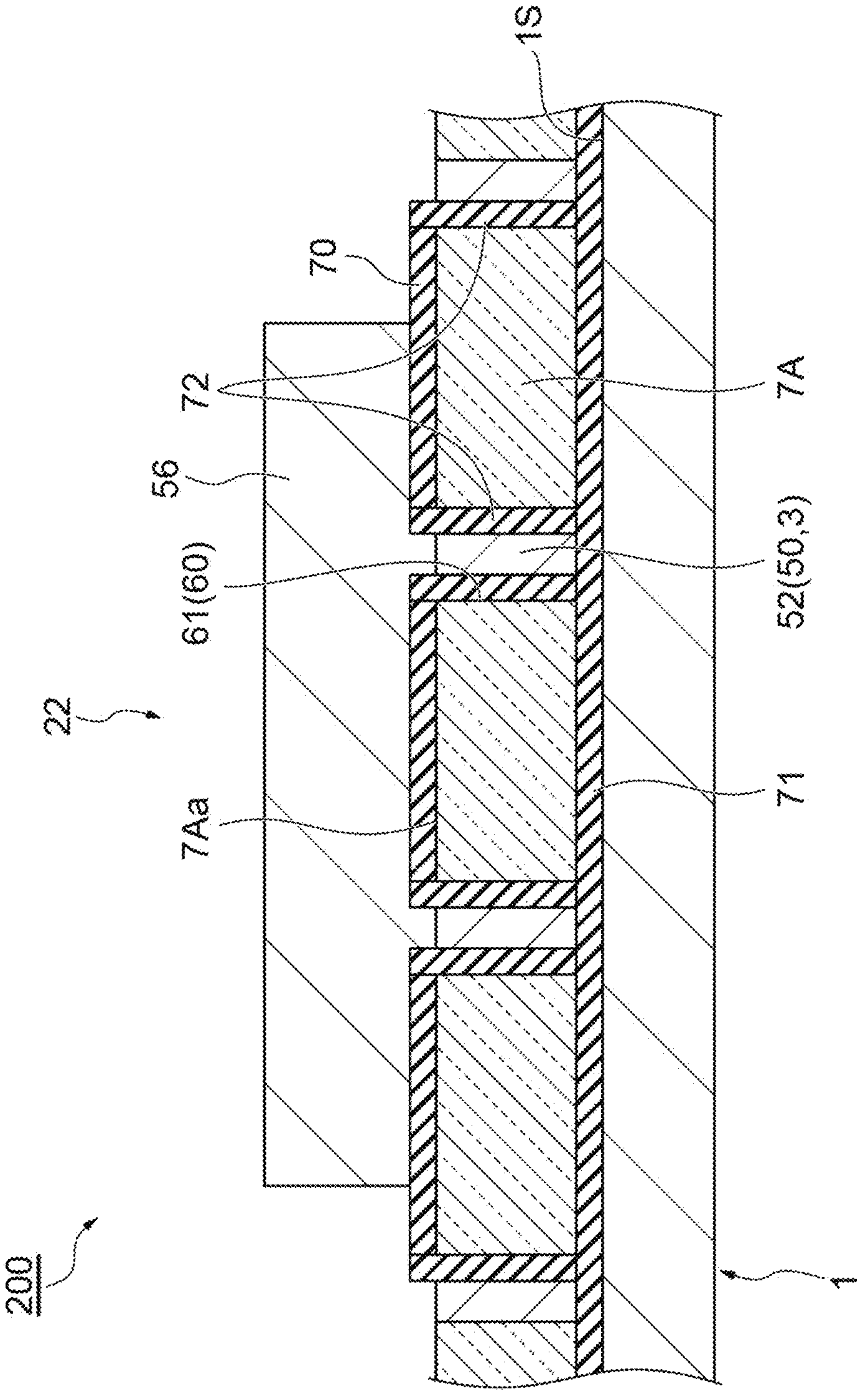
FIG. 8 is a cross-sectional view illustrating a wiring body according to a modification.

As illustrated in FIG. 8, as with the conductor pattern 50, the conductor layer 56 may be formed by plating. In this case, copper may be used as the material of the conductor layer 56. In addition, the wiring body 200 has regions 70, 71, and 72. The regions 70, 71, and 72 are regions where a metal different from the metal constituting the conductor layer 56 and the conductor pattern 50 is present. The conductor layer 56 has the regions 70 formed so as to be dispersed on the insulating resin portion 7A side. The conductor pattern 50 has the regions 72 formed so as to be dispersed on the insulating resin portion 7A side. The region 71 is disposed between the insulating resin portion 7A and the light transmissive substrate 1. In the region 71, metal fine particles are dispersed between the insulating resin portion 7A and the light transmissive substrate 1. For easy understanding of the configuration, the regions 70, 71, and 72 are illustrated in FIG. 8 as being arranged continuously as layers, but the regions 70, 71, and 72 may not necessarily be arranged continuously. The material of the regions 70, 71, and 72 is not particularly limited, but for example, the same material as that of the underlying layer 13 may be used. The wiring body 200 having such a configuration is manufactured as follows. Metal-containing paint used for forming the regions 71 is applied onto the light transmissive substrate 1, and then, the insulating resin portion 7A is imprinted thereon. Next, metal-containing paint used for forming the regions 70 is applied to the surface 7Aa of the insulating resin portion 7A. Next, the conductor layer 56 and the conductor pattern 50 are plated. At this time, the metal-containing paint in the regions 70 drips, whereby the regions 72 are formed. As described above, both the conductor layer 56 and the conductor pattern 50 can be formed by plating. In a case where the same material as that of the underlying layer 13 is used for the regions 70, 71, and 72, the resin contained in the underlying layer 13 may be removed after the application.

The technique according to the present disclosure includes the following configuration examples, yet is not limited thereto.

A wiring body according to an aspect of the present disclosure includes an electrode and a terminal, in which the electrode and the terminal each have a conductor pattern including a plurality of openings, and the terminal has, on the conductor pattern, a conductor layer extending in a planar shape so as to cover at least a part of the conductor pattern.

In the wiring body described above, the electrode and the terminal each have a conductor pattern including a plurality of openings. Among them, the terminal is connected to an external connection terminal, and electrically connects the connection terminal and the electrode. The terminal has, on the conductor pattern, the conductor layer that extends in a planar shape so as to cover the conductor pattern. The terminal is therefore connected to the external connection terminal via the conductor layer extending in a planar shape. This configuration can increase conduction between the terminal and the external connection terminal as compared with a case where the conductor pattern including a plurality of openings is connected to the external connection terminal.

The conductor pattern including the plurality of openings may be a mesh-like conductor pattern. In this case, high transparency can be achieved while conductivity is exhibited in the electrode. Further, the conductor patterns in the electrode and the terminal can be easily and collectively formed with high accuracy.

In plan view, the outer edge of the conductor layer may be located inside the outer edge of the conductor pattern in the terminal. In this case, it is possible to prevent the outer edge of the conductor layer from extending beyond the outer edge of the conductor pattern in the terminal. This prevents the conductor layer from short-circuiting with another conductor pattern adjacent to the terminal. In addition, it is possible to prevent the visibility from being increased due to protrusion of the conductor layer toward the electrode side.

The wiring body may further include the substrate on which the electrode and the terminal are provided, and the resin portion provided on the substrate, the resin portion may have the mesh-like trench, the conductor pattern of the terminal may be provided in the trench, and the terminal may have the region in which the height position of the interface between the conductor layer and the conductor pattern is different from that of the surface of the resin portion. In this case, the mesh-like resin portion or the conductor pattern wedges into the conductor layer, which can increase the connection reliability of the conductor layer with respect to the conductor pattern of the terminal.

In the region, the ratio of the interface located at the height position closer to the substrate side than the surface of the resin portion may be high. In this case, the mesh-like resin portion wedges into the conductor layer, which can increase the connection reliability of the conductor layer with respect to the conductor pattern of the terminal.

The sum of the thicknesses of the conductor pattern of the terminal and the conductor layer may be larger than the thickness of the conductor pattern of the electrode. In this case, the thickness of the terminal is made larger than that of the electrode, which makes it easy for an external connection terminal to be connected to the terminal.

The thickness of the conductor layer may be larger than the thickness of the conductor pattern of the terminal. In this case, the thickness of the terminal is increased, which makes it easy for an external connection terminal to be connected to the terminal.

The surface roughness of the conductor layer may be greater than the surface roughness of the conductor pattern of the terminal. In this case, the connection strength of the external connection terminal to the surface of the conductor layer can be increased.

The conductor layer may contain silver, and the conductor pattern may contain copper. In this case, a conductor having high conductivity is used for the part connected to an external connection terminal, which reduces the resistance value and further increases the conduction with the external connection terminal.

The conductor layer may contain copper, and the conductor pattern may contain copper. In this case, both the conductor layer and the conductor pattern can be formed by plating.

A display device according to an aspect of the present disclosure includes the wiring body.

According to the display device, functions and effects similar to those of the above-described wiring body can be obtained.

Embodiment 1

A wiring body including:
- an electrode; and
- a terminal, in which
- the electrode and the terminal each have a conductor pattern including a plurality of openings, and
- the terminal has, on the conductor pattern, a conductor layer extending in a planar shape so as to cover at least a part of the conductor pattern.

Embodiment 2

The wiring body according to embodiment 1, in which the conductor pattern including the plurality of openings is a mesh-like conductor pattern.

Embodiment 3

The wiring body according to embodiment 1 or 2, in which, in plan view, an outer edge of the conductor layer is located inside an outer edge of the conductor pattern in the terminal.

Embodiment 4

The wiring body according to any one of embodiments 1 to 3, further including:
- a substrate on which the electrode and the terminal are provided; and
- a resin portion provided on the substrate, in which
- the resin portion has a mesh-like trench,
- the conductor pattern of the terminal is provided in the trench, and
- the terminal has a region in which a height position of an interface between the conductor layer and the conductor pattern is different from a height position of a surface of the resin portion.

Embodiment 5

The wiring body according to embodiment 4, in which, in the region, a ratio of the interface located at a height position closer to the substrate side than the surface of the resin portion is high.

Embodiment 6

The wiring body according to any one of embodiments 1 to 5, in which a sum of thicknesses of the conductor pattern of the terminal and the conductor layer is larger than a thickness of a conductor pattern of the electrode.

Embodiment 7

The wiring body according to any one of embodiments 1 to 6, in which a thickness of the conductor layer is larger than a thickness of the conductor pattern of the terminal.

Embodiment 8

The wiring body according to any one of embodiments 1 to 7, in which surface roughness of the conductor layer is greater than surface roughness of the conductor pattern of the terminal.

Embodiment 9

The wiring body according to any one of embodiments 1 to 8, in which the conductor layer contains silver, and the conductor pattern contains copper.

Embodiment 10

The wiring body according to any one of embodiments 1 to 7, in which the conductor layer contains copper, and the conductor pattern contains copper.

Embodiment 11

A display device including the wiring body according to any one of embodiments 1 to 10.

REFERENCE SIGNS LIST

1 Light transmissive substrate (substrate)
1S Main surface of substrate
7A Insulating resin portion (resin portion)
21 Electrode
22 Terminal
50 Conductor pattern

56 Conductor layer
100 Display device
200 Wiring body

The invention claimed is:

1. A wiring body comprising:
- an electrode; and
- a terminal, wherein
- the electrode and the terminal each have a conductor pattern including a plurality of openings,
- the terminal has, on the conductor pattern, a conductor layer extending in a planar shape so as to cover at least a part of the conductor pattern, and
- the conductor layer is in direct contact with a surface of the conductor pattern.

2. The wiring body according to claim 1, wherein the conductor pattern including the plurality of openings is a mesh-like conductor pattern.

3. The wiring body according to claim 1, wherein, in plan view, an outer edge of the conductor layer is located inside an outer edge of the conductor pattern in the terminal.

4. The wiring body according to claim 1, further comprising:
- a substrate on which the electrode and the terminal are provided; and
- a resin portion provided on the substrate, wherein
- the resin portion has a mesh-like trench,
- the conductor pattern of the terminal is provided in the trench, and
- the terminal has a region in which a height position of an interface between the conductor layer and the conductor pattern is different from a height position of a surface of the resin portion.

5. The wiring body according to claim 4, wherein, in the region, a ratio of the interface located at a height position closer to the substrate side than the surface of the resin portion is high.

6. The wiring body according to claim 1, wherein a sum of thicknesses of the conductor pattern of the terminal and the conductor layer is larger than a thickness of a conductor pattern of the electrode.

7. The wiring body according to claim 1, wherein a thickness of the conductor layer is larger than a thickness of the conductor pattern of the terminal.

8. The wiring body according to claim 1, wherein surface roughness of the conductor layer is greater than surface roughness of the conductor pattern of the terminal.

9. The wiring body according to claim 1, wherein the conductor layer contains silver, and the conductor pattern contains copper.

10. The wiring body according to claim 1, wherein the conductor layer contains copper, and the conductor pattern contains copper.

11. A display device comprising the wiring body according to claim 1.

12. A wiring body comprising:
- an electrode;
- a terminal;
- a substrate on which the electrode and the terminal are provided; and
- a resin portion provided on the substrate, wherein
- the electrode and the terminal each have a conductor pattern including a plurality of openings,
- the terminal has, on the conductor pattern, a conductor layer extending in a planar shape so as to cover at least a part of the conductor pattern,
- the resin portion has a mesh-like trench,
- the conductor pattern of the terminal is provided in the trench, and
- the terminal has a region in which a height position of an interface between the conductor layer and the conductor pattern is different from a height position of a surface of the resin portion.

13. A wiring body comprising:
- an electrode; and
- a terminal, wherein
- the electrode and the terminal each have a conductor pattern including a plurality of openings,
- the terminal has, on the conductor pattern, a conductor layer extending in a planar shape so as to cover at least a part of the conductor pattern, and
- an area of the conductor layer is 95% or more of an entire area of the terminal.

* * * * *